United States Patent [19]

Saitoh et al.

[11] Patent Number: 4,961,103
[45] Date of Patent: Oct. 2, 1990

[54] SEMICONDUCTOR DEVICE HAVING POLYCRYSTALLINE SILICON RESISTOR

[75] Inventors: Manzoh Saitoh; Kenji Okamura, both of Tokyo, Japan

[73] Assignee: NEC Corporation, Tokyo, Japan

[21] Appl. No.: 276,108

[22] Filed: Nov. 23, 1988

[30] Foreign Application Priority Data

Nov. 27, 1987 [JP] Japan .................. 62-300905

[51] Int. Cl.⁵ ............... H01L 27/02; H01L 29/34; H01L 29/04; H01L 23/48
[52] U.S. Cl. .......................... 357/59; 357/51; 357/54; 357/67; 357/71
[58] Field of Search .............. 437/233; 357/54, 59, 357/51, 67, 71

[56] References Cited

U.S. PATENT DOCUMENTS

| | | | |
|---|---|---|---|
| 4,001,762 | 1/1977 | Aoki et al. | 357/51 |
| 4,406,051 | 9/1983 | Iizuka | 437/233 |
| 4,451,328 | 5/1984 | Dubois | 357/59 |
| 4,590,508 | 5/1986 | Hirakawa et al. | 357/59 |
| 4,702,937 | 10/1987 | Yamoto et al. | 437/233 |

OTHER PUBLICATIONS

T. Ohzone, M. Fukumoto, G. Fuse, A. Shinohara, S. Odanaka, and M. Sasago, "Ion–Implanted Thin Polycrystalline-Silicone High-Value Resistors for High--Density Poly-Load Static RAM Applications", (*IEEE Transactions on Electron Devices*, vol. ED-32, No. 9, Sep. 1985).

M. K. Lee, C. Y. Lu, K. Z. Chang and C. Shih, "On the Semi-Insulating Polycrystalline Silicon Resistor", (*Solid State Electronics*, vol. 27, No. 11, pp. 995–1001, 1984).

*Primary Examiner*—J. Carroll
*Attorney, Agent, or Firm*—Helfgott & Karas

[57] ABSTRACT

A semiconductor device having a silicon resistor element is disclosed. The silicon resistor element includes a first polycrystalline silicon film containing oxygen atoms with a low density, and a second polycrystalline silicon film disposed on the first polycrystalline silicon film and containing oxygen atoms with a high density. A silicon oxide film converted from polycrystalline silicon is attached to the top surface of the second polycrystalline silicon film.

9 Claims, 5 Drawing Sheets

SEMICONDUCTOR DEVICE HAVING POLYCRYSTALLINE SILICON RESISTOR

BACKGROUND OF THE INVENTION

The present invention relates to a semiconductor device having a polycrystalline silicon resistor containing oxygen atoms.

Polycrystalline silicon resistors have been widely used in semiconductor devices, and various types have been proposed, for example, by Ming-Kwang Lee et al. entitled "ON THE SEMI-INSULATING POLYCRYSTALLINE SILICON RESISTOR" in Solid-State Electronics Vol. 27, No. 11, 1984, pp. 995–1001, by Takashi Ohzone et al. entitled "Ion-Implanted Thin Polycrystalline-Silicon High-Value Resistors for High-Density Poly-Load Static RAM Applications" in IEEE TRANSACTIONS ON ELECTRON DEVICES, Vol. ED32, No. 9 September 1955, pp. 1749–1756, etc. These resistors employ phosphorus, arsenic and/or boron atoms for determining their resistance values. On the other hand, so-called "SIPOS" (Semi-Insulating Polycrystalline-Silicon) type resistors, in which oxygen atoms are contained in the polycrystalline silicon film with ion-implanted phosphorus or arsenic atoms, have been proposed. The resistance value of the SIPOS type resistor element is determined by the amount of or the density of the oxygen atoms contained in the polycrystalline silicon film, and therefore, a high resistance value can be obtained.

However, when the density of oxygen atoms in the polycrystalline silicon film is a high level, the control of the density is difficult in the process step. Therefore, the resistivity of the polycrystalline silicon film has a large deviation among wafer lots and among polycrystalline silicon films in a wafer. Consequently, a resistor having a higher resistance cannot be obtained with a precise resistance value. On the other hand, if the density of oxygen atoms is set to be low-level and the thickness of the polycrystalline silicon film is thinned to obtain a higher resistance, a precise control of the resistance is also impossible because a silicon oxide layer thermally converted from the surface part of the polycrystalline silicon film must be provided for stabilizing the resistor element, and therefore, the remaining film thickness, which dimension determines the resistance value, is relatively, largely deviated. Specially, the control of the silicon oxide film, that is, the control of the thickness of the remaining polycrystalline silicon film through the oxidation is difficult when the density of oxygen atoms therein is low.

In the prior art SIPOS type resistor element, oxygen atoms are uniformly distributed in the polycrystalline silicon film in the entire thickness. Therefore, a silicon resistor element having a higher resistance value with a precise control is impossible.

SUMMARY OF THE INVENTION

An object of the present invention is to provide a semiconductor device having a silicon resistor element containing oxygen atoms which resistor element has a higher resistance value with a precise control.

According to a feature of the present invention, there is provided a semiconductor device comprising a semiconductor substrate having a major surface, an insulating layer formed on the major surface of the substrate, a silicon resistor element formed on the insulating layer, and an insulating film formed on the silicon resistor element, the silicon resistor element including a first polycrystalline silicon film containing oxygen atoms and a second polycrystalline silicon film containing oxygen atoms with a density higher than the density of the oxygen atoms in the first polycrystalline silicon film and attached to the first polycrystalline silicon film at its bottom, and the insulating film being a silicon oxide film converted from polycrystalline silicon attached to the top surface of the second polycrystalline silicon film.

The density of oxygen atoms in the first polycrystalline silicon film, which determines substantially the resistance value of the silicon resistor element, is favorably 15 atomic percents or less for decreasing the deviation of the resistivity, and the density of oxygen atoms in the second polycrystalline silicon film is favorably 20 atomic percents or more for not influencing its resistance value to the resistance value of the silicon resistor element so that the resistance value of the silicon resistor element can be substantially estimated only by the first polycrystalline silicon film and for preventing effectively the first polycrystalline silicon film from the oxidation to form the thermal silicon oxide film on the silicon resistor element. Further, in view of the control of the film thickness and the control of the high resistance value, the first polycrystalline silicon film has the thickness favorably ranging from 100 Å to 1000 Å.

Generally, first and second connecting portions connected to respective ends of the silicon resistor are provided. Each of the first and second connecting portions includes a first polycrystalline silicon film continuously formed from the first polycrystalline silicon film of the silicon resistor element and a second polycrystalline silicon film continuously formed from the second polycrystalline silicon film of the silicon resistor element. A metallic wiring electrode may be connected to the first connecting portion and at least one of the first and second connecting portions may be contacted directly to an impurity region formed in the substrate. When metal silicide films are formed on the second polycrystalline silicon films of the connecting portions entirely, the connecting portions are employed as wiring layers connected to the silicon resistor element. Further, atoms selected from a group consisting of phosphorus, arsenic and boron may be contained in the first and second polycrystalline silicon films with the containing oxygen atoms, specially in the connecting portions to improve contact natures. Also, these atoms of the group may be contained in the silicon resistor element. Even though the existence of these atoms of the group, however, the resistance value of the silicon resistor element is determined predominantly by the density of oxygen atoms in the silicon resistor element, that is, by the density of oxygen atoms in the first polycrystalline silicon film of the silicon resistor element. The silicon resistor element of the present invention may be used as a load resistor in SRAM cell, and as other resistor elements of the semiconductor device.

DESCRIPTION OF A PRIOR ART

Figure 1A:
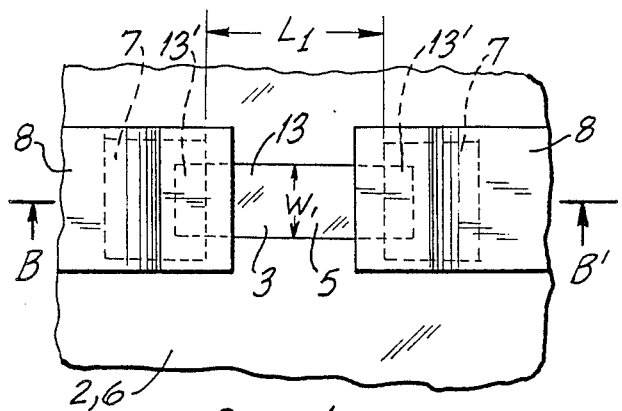
FIG. 1A is a plan view showing a polycrystalline silicon resistor in a prior art.
Figure 1B:
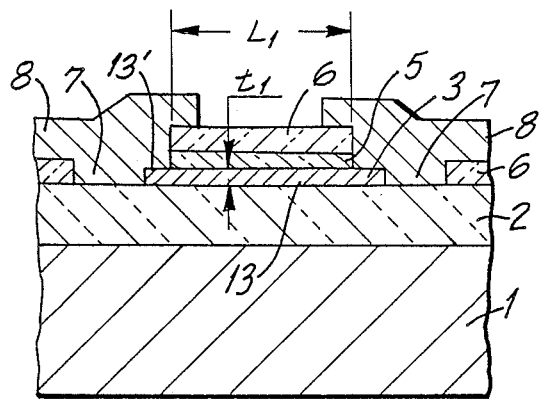
FIG. 1B is a cross-sectional view taken along line B—B' in FIG. 1A as viewed in the direction of arrows.
Figure 4:
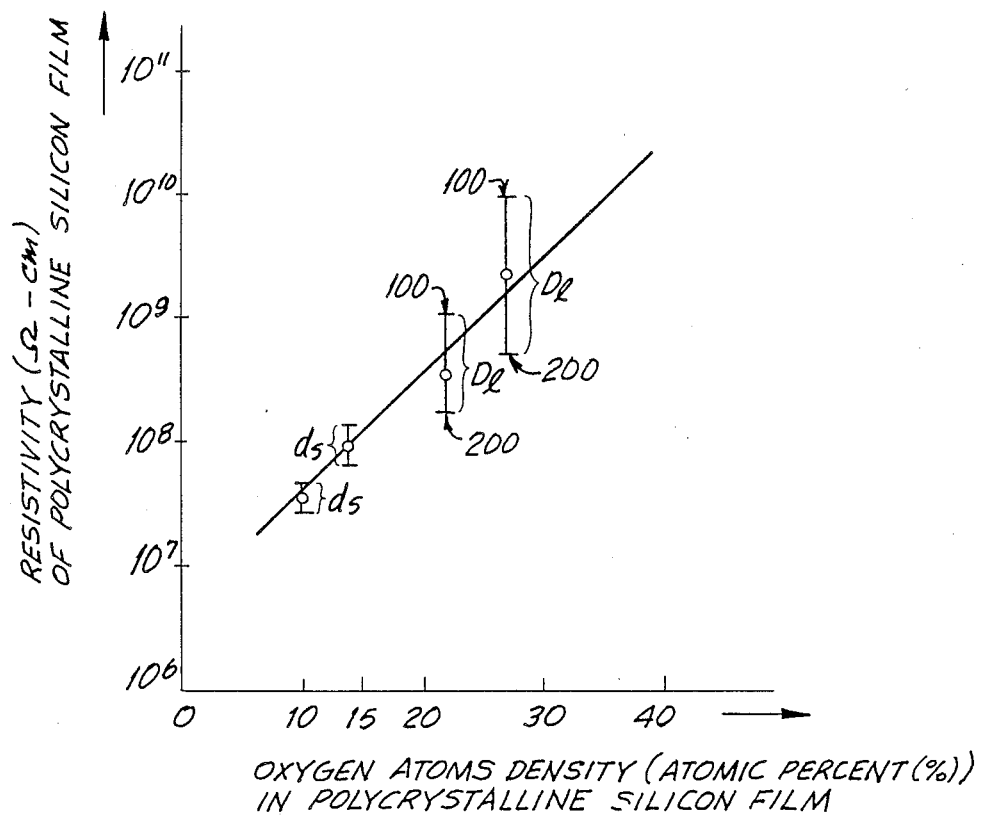
FIG. 4 is a graph showing the resistivity and the deviation thereof in every density of oxygen atoms to be set in the process step in a polycrystalline silicon film.

Referring to FIGS. 1A and 1B, on a thick field silicon oxide layer 2 covering a major surface of a silicon substrate 1, a polycrystalline silicon film containing oxygen atoms is formed, and a silicon oxide film 5 thermally converted from the upper surface of the polycrystalline silicon film is formed such that the remaining polycrystalline film 3 constitutes a silicon resistor element 13. Further, a silicon oxide layer 6 by CVD (Chemical Vapour Deposition) method is entirely formed, and a pair of contact holes 7, 7 are provided in the silicon oxide layer 6 to expose both connecting portions 13', 13' of the polycrystalline silicon film 3. Aluminum wiring layers 8, 8 are connected to respective connecting portions 13', 13' of the polycrystalline silicon film 3. The effective length $L_1$ of the silicon resistor 13 between the contact holes 7, 7 is 1.5 $\mu$m, and the width $W_1$ thereof is 0.8 $\mu$m. The thickness $t_1$ of the silicon resistor 13 is 0.2 $\mu$m, and that of the thermal silicon oxide film 5 is 0.1 $\mu$m. The silicon resistor 13, that is, the polycrystalline silicon film 3 contains oxygen atoms by a density of 22 atomic percents uniformly in the entire thickness, and therefore, the resistivity of the polycrystalline silicon film 3 becomes $4 \times 10^8$ $\Omega$-cm. The resistance value of the silicon resistor 13 can be calculated to be $37.5 \times 10^{12}$ $\Omega$ and its value is sufficient to be used as a load resistor in a 4M bit SRAM cell which necessitates a high resistance value of $20 \times 10^{12}$ $\Omega$ or more. However, the resistivity of the silicon resistor 13 is inevitably, largely deviated among a plurality of devices and/or amount a plurality of silicon resistor elements, and therefore, a precise control on the resistance value is difficult. Referring to FIG. 4, when the density of oxygen atoms is set to be 20% (atomic percent) or more, a large deviation is inevitably caused as indicated by $D_l$. That is, the maximum value 100 of the resistivity becomes about ten times the minimum value 200 in every settled oxygen atoms density of 20% or more.

On the other hand, when a polycrystalline silicon film having a lower oxygen atoms is used, the thickness of the film must be thinner such as 0.03 $\mu$m so that the high resistance value of $20 \times 10^{12}$ $\Omega$ or more is obtained. In this case, also the resistance value can not be precisely controlled because of the formation of the converted silicon oxide film on the silicon resistor.

Detailed Description of Embodiments

Figure 2A:
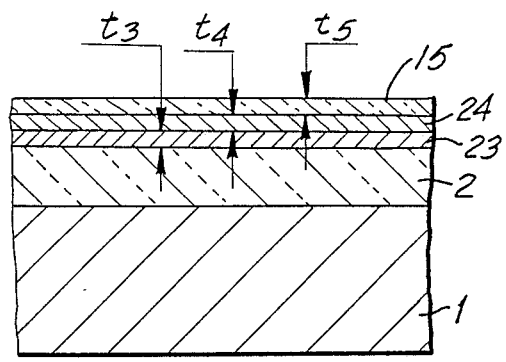
FIGS. 2A to 2C are cross-sectional views showing manufacturing process steps in sequence for forming a first embodiment of the present invention.

First Embodiment:

Referring to FIG. 2A, on a thick field silicon oxide layer 2 covering a major surface of a P-type silicon substrate 1, a first polycrystalline silicon film having 300 Å thickness and containing oxygen atoms by 10 atomic percents is formed through a first CVD method by flowing a mixture gas of monosilane (SiH$_4$) gas and nitrous oxide (N$_2$O) gas under a depressed atmospheric pressure at 620° C. temperature. Next, a second polycrystalline silicon film containing oxygen atoms by 28 atomic percents is formed on the first polycrystalline silicon film through a second CVD method by increasing the ratio of nitrous oxide gas in the mixture gas than that in the first CVD method, under a depressed atmospheric pressure at 620° C. temperature. Thereafter, a silicon oxide film is formed by converting thermally the upper surface part of the second polycrystalline silicon film under oxidizing atmosphere at high temperature. At this time, the thickness of the second polycrystalline silicon film is decreased, but the thickness of the first polycrystalline silicon film is not changed and maintains its extremely thin thickness of 300 Å because the second polycrystalline silicon film fulfills sufficiently a role to prevent the first polycrystalline silicon film from the oxidation. As a result, a first polycrystalline silicon film 23 having the thickness $t_3$ of 300 Å and containing oxygen atoms distributing uniformly in all portions of the film 23 with 10 atomic percents, a second polycrystalline silicon film 24 having the thickness $t_4$ of 1000 Å and containing oxygen atoms distributing uniformly in all portions of the film 24 with 28 atomic percents, and a thermal silicon oxide film 15 having the thickness of 800 Å are obtained.

Figure 2B:
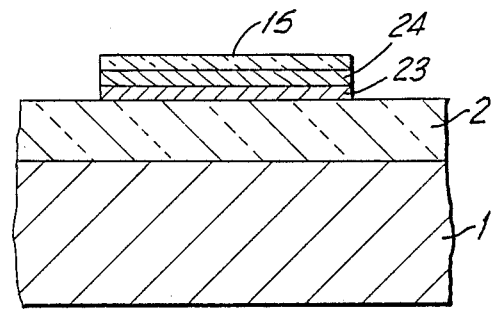

Next, these films 15, 24, 23 are shaped in sequence to a same plan figure by a well known photolithography technique (FIG. 2B).

Figure 2C:
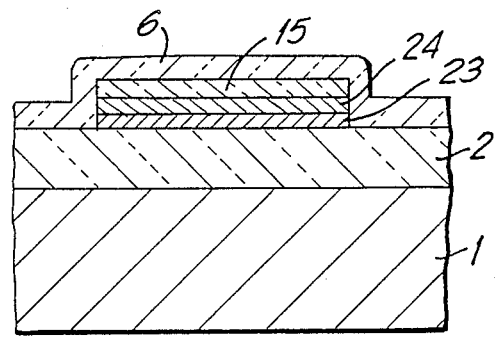

Then, a silicon oxide layer 6 of 3000 Å is entirely deposited by a CVD method (FIG. 2C).

Figure 3A:
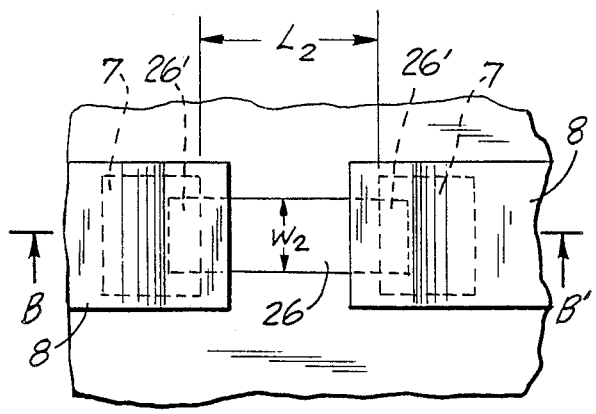
FIG. 3A is a plan view showing the first embodiment of the present invention.
Figure 3B:
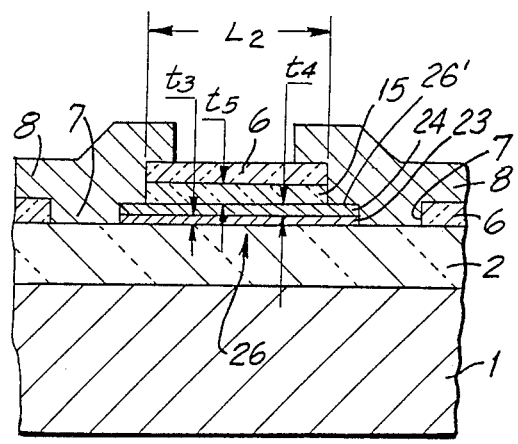
FIG. 3B is a cross-sectional view taken along line B—B' in FIG. 3A as viewed in the direction of arrows.

Thereafter, as shown in FIGS. 3A and 3B, a pair of contact holes 7, 7 are formed in the silicon oxide layer 6 to expose connecting portions 26', 26' for the silicon resistor element 26, and aluminum wiring layers 8, 8 are connected to the connecting portions through the contact holes 7, 7. The resistivity of the first polycrystalline silicon film 23 containing 10 atomic percents oxygen atoms is $4 \times 10^7$ $\Omega$-cm, and therefore, when the width $W_2$ of the silicon resistor element 26 is 0.8 $\mu$m and the length (effective length) $L_2$ is 1.5 $\mu$m, the resistance value of the silicon resistor element 26 between the contact holes 7, 7 is calculated to be $25 \times 10^{12}$ $\Omega$. The resistance in the second polycrystalline silicon film 24 is very high in comparison with that in the first polycrystalline silicon film 23. Therefore, in the calculation of the resistance value of the silicon resistor, the former can be neglected.

Referring to FIG. 4, when the oxygen atoms density is set in the process step to be 15 atomic percents or less, the deviation $d_s$ of the resistivity becomes small, and therefore, the resistance value of the embodiment can be precisely controlled.

Figure 5:
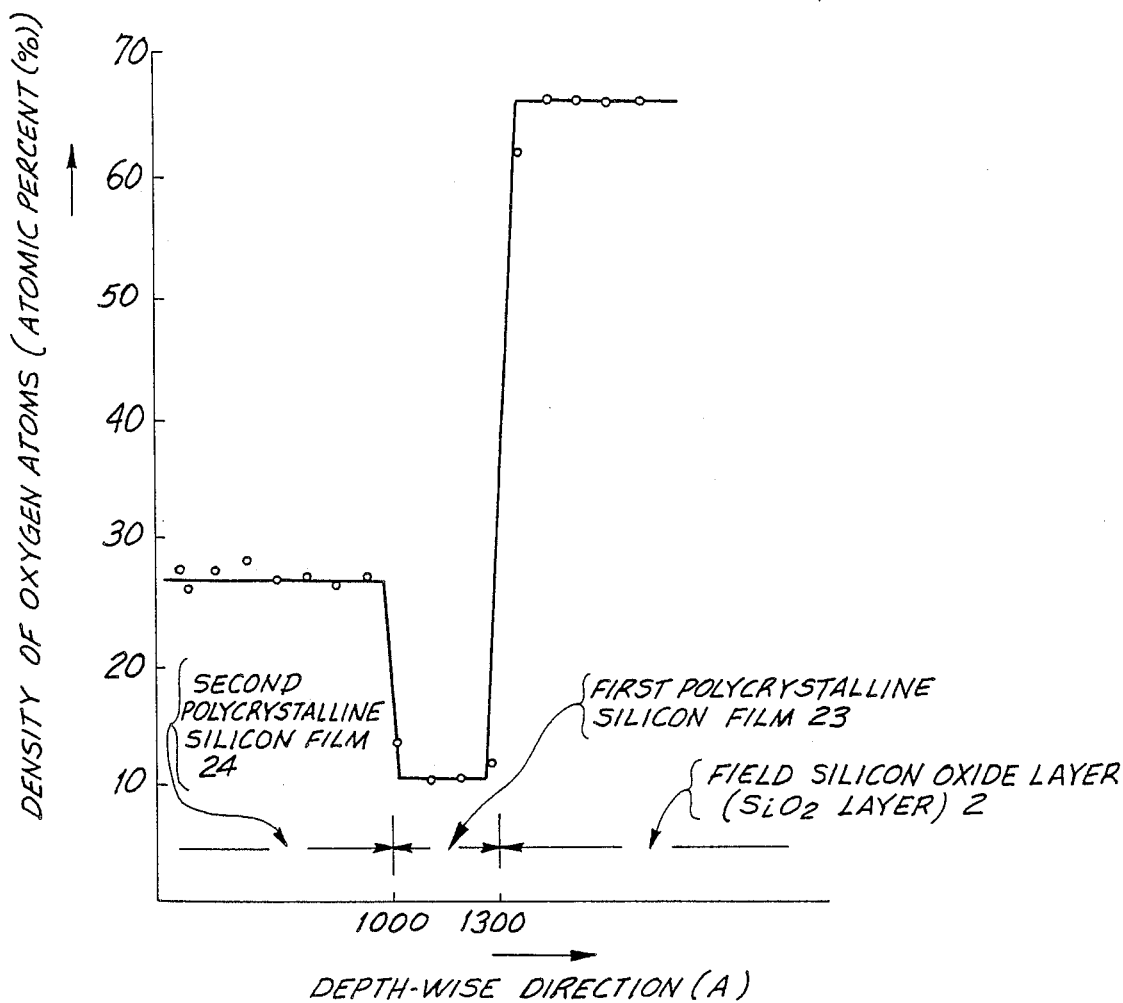
FIG. 5 is a graph showing a distribution of the density of atoms in the direction of thickness according to the present invention.

FIG. 5 shows an experimental result by SIMS (Secondary Ion Mass Spectroscopy) on the density of oxygen atoms in the depthwise direction from the surface of the second polycrystalline silicon film.

In the present specification, the explanation "a polycrystalline silicon film containing oxygen atoms by Y atomic percents", "a density of oxygen atoms in a polycrystalline silicon film is Y atomic percents" or the like explanation means that $Y \times K$ oxygen atoms are substantially, uniformly distributed in $(100-Y) \times K$ silicon atoms of the film in form of $SiO_2$ particles, SiO particles, $Si_2O_3$ particles or the like; where K is constant.

Figure 6:
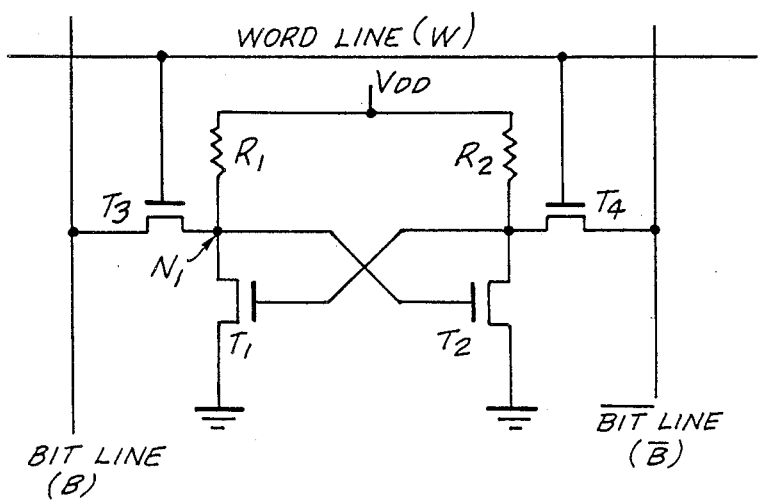
FIG. 6 is a circuit diagram showing a SRAM cell.

Second Embodiment:

A silicon resistor of the second embodiment is used as a load resistor $R_1$ (or $R_2$) connected at a node $N_1$ (or $N_2$) to a driver transistor $T_1$ (or $T_2$) and a switching transistor $T_3$ (or $T_4$) of a static random access memory cell (SRAM cell) shown in FIG. 6.

Figure 7A:
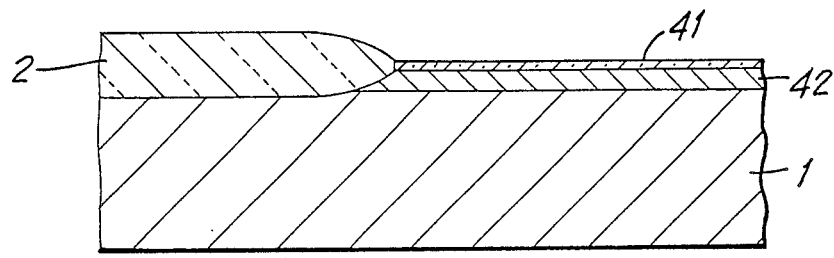
FIGS. 7A to 7C are cross-sectional views showing manufacturing process steps in sequence for forming a second embodiment of the present invention and the second embodiment.

After forming a thick field silicon oxide layer 2 and a thin gate silicon oxide film 41 on a major surface of a P-type silicon substrate 1, an N-type common source or drain region 42 of the driver and switching transistors is formed by arsenic ion implantation method through the gate insulating film (FIG. 7A).

Figure 7B:
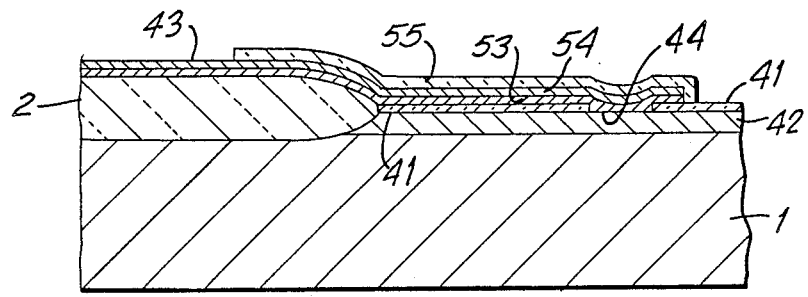

Next, after forming a contact hole 44 in the gate insulating film 41, a first polycrystalline silicon film 53 having 300 Å thickness and containing oxygen atoms by 10 atomic percents density, and a second polycrystalline silicon film 54 containing oxygen atoms by 28 atomic percents density by the same method as the process step shown in FIG. 2A of the first embodiment. Then, the first and second polycrystalline silicon films 53, 54 are shaped in the same plan figure each other by a well known photolithography technique, and be subjected to a heat treatment under an oxidizing atmosphere to form a thermal oxide film 55 of 800 Å thickness from the upper surface of the second film 54 and the side surfaces of the first and second films 53, 54. By the oxidation step, the thickness of the second polycrystalline silicon film becomes 1000 Å. Then, a contact hole 43 is formed in the thermal oxide film 55 (FIG. 7B).

Next, a phospho-silicate glass (hereinafter called as PSG) layer 45 is entirely and a heat treatment at 950° C. temperature is conducted. By the heat treatment arsenic atoms are diffused from the impurity region 42 through the contact hole 44 into end portions 53' and 54' of the first and second polycrystalline silicon films 53 and 54 and phosphorus atoms are diffused from the PSG layer 45 through the contact hole 43 into contact portions 53" and 54" of the first and second polycrystalline silicon films 53 and 54. Then, a contact hole 48 is formed in the PSG layer 45 and an aluminum wiring electrode 49 is connected to the silicon films 53, 54 through the contact hole 45. The resistance value of the silicon resistor of the second embodiment is substantially determined by the resistance value of the first polycrystalline silicon film 53 between the contact holes 44 and 48 and the resistance value of the second polycrystalline silicon film 54 is neglected to calculate the resistance value of the silicon resistor as the first embodiment. Further, the resistance value of the first polycrystalline silicon film 53 between the contact holes 44 and 48 is predominantly determined by the density of oxygen atoms uniformly contained in the first film 53 rather than by arsenic and phosphorus atoms in the vicinity of contact holes 44 and 48.

Figure 7C:
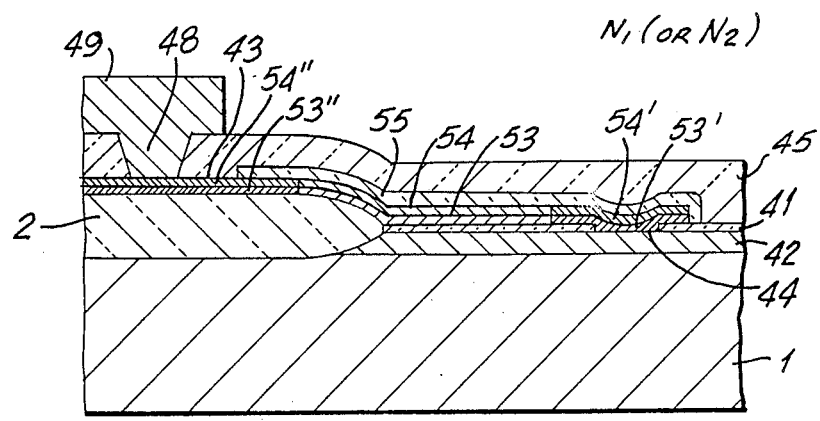
Figure 8:
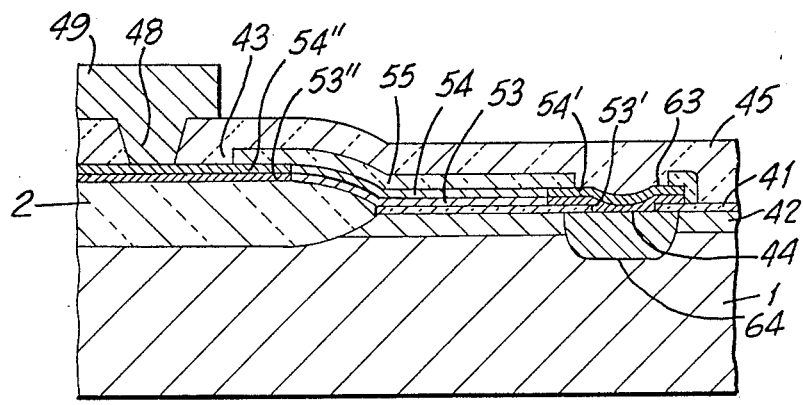
FIG. 8 is a cross-sectional view showing a modification of the second embodiment.

FIG. 8 shows a modified structure of the FIG. 7. In FIG. 8, the same component as those in FIG. 7 are indicated by the same reference numerals. When the contact hole 43 is formed, a contact hole 63 is also formed in the thermal silicon oxide film 55 above the contact hole 44 in the gate insulating film 41. In this case, phosphorus atoms are introduced from the PSG layer 45 through the contact hole 63 during the above mentioned heat treatment. The diffusion coefficient of phosphorus is larger than that of arsenic. Therefore, the portions 53', 54' contain predominantly phosphorus atoms than arsenic atoms, and further, a deep N-type region 64 is formed by the diffused phosphorus atoms in the substrate thereby realizing a reliable contact structure between the source or drain region and the silicon resistor element.

Figure 9A:
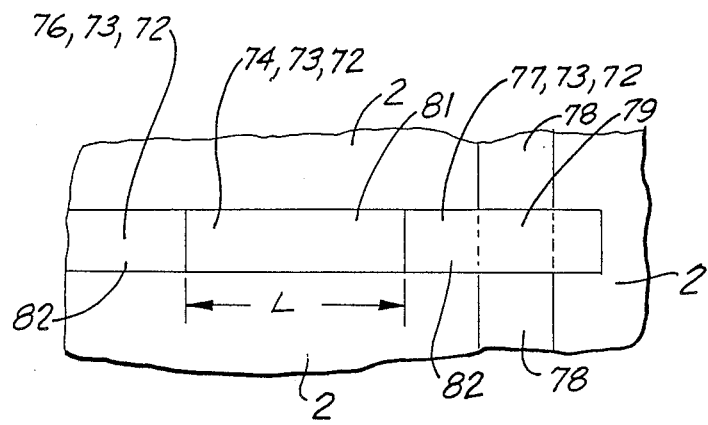
FIG. 9A is a plan view showing a third embodiment of the present invention.
Figure 9B:
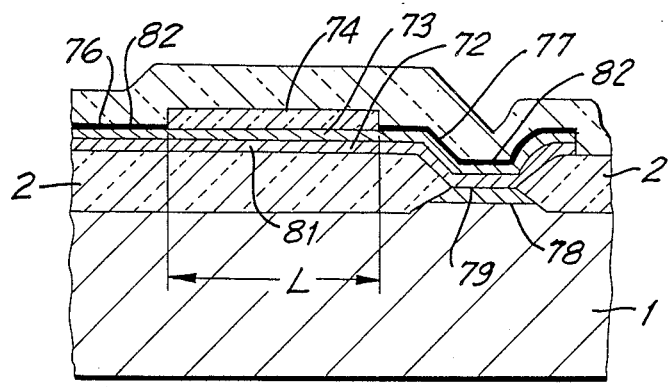
FIG. 9B is a cross-sectional view taken along line B—B' in FIG. 9A as viewed in the direction of arrows.

Third Embodiment:

Referring to FIG. 9A and 9B, a thick field silicon oxide layer 2 is formed on a major surface of a P-type silicon substrate 1 and an N-type impurity region 78 of an active element such as a transistor or of a wiring diffusion layer is formed in the major surface of the substrate 1 between the field insulating layer 2. A silicon layer consisting of a first polycrystalline silicon film 72 having the thickness of 300 Å and containing oxygen atoms by 10 atomic percents and a second polycrystalline silicon film 73 having about 1000 Å and containing oxygen atoms by 28 atomic percents is formed. The silicon layer is contacted to the surface 79 of the impurity region 78 at the bottom part of the first polycrystalline silicon film. On a resistor element section 81 of the silicon layer, a thermal silicon oxide film 74 is formed by converting thermally the upper surface of the second polycrystalline silicon film. The first and second polycrystalline silicon films and the thermal silicon oxide film can be formed by the same process steps shown in FIGS. 2A and 2B of the first embodiment and by adding further a photolithography method to form the thermal silicon oxide film only on the resistor section 81 of the first and second polycrystalline silicon films. Then, a high melting metal silicide films 76, 77 such as platinum silicide (Pt-Si) films are formed on the exposed upper surface of the second polycrystalline silicon film of portions 82, 82 except the resistor section 81. Finally, a PSG layer is entirely deposited as a passivation layer. The resistance value of the resistor element is determined by the resistance value of the first polycrystalline silicon film at the resistor portion L between the silicide films 76 and 77, and the resistance value of the second polycrystalline silicon film can be neglected to calculated the resistance value of the silicon resistor as the first and second embodiments. The other portions of the silicon layer on which the metal silicide films are provided are used as wiring layers connected to both side of the resistor element. Owing to the metal silicide films, the wiring layers have low electrical resistance nature. Favorably, impurities such as phosphorus atoms may be introduced in the portions 82, 82, particularly above the contact surface 79, so that the silicon layers using the wiring layer decrease further the electrical resistance.

What is claimed is:

1. A semiconductor device comprising a semiconductor substrate having a major surface; an insulating layer formed on said major surface of said substrate and having an upper surface; a silicon resistor element formed on said upper surface of said insulating layer and having a specified resistance value; first and second connecting portions connected to respective ends of said silicon resistor element and each formed on said upper surface of said insulating layer; an insulating film formed on said silicon resistor element; and first and second metallic wiring layers connected to said first and second connecting portions, respectively;

said silicon resistor element including a first polycrystalline silicon film having an upper face and containing oxygen of at most 15 atomic percents and being formed on said upper surface of said insulating layer with a thickness ranging from 100 Å to 1000 Å for determining substantially said specified resistance value of said silicon resistor element, and a second polycrystalline silicon film having a top face and containing oxygen of at least 20 atomic percents and being attached to said upper face of said first polycrystalline silicon film for protecting said upper face of said first polycrystalline silicon film from thermal oxidation;

said insulating film being a silicon oxide film thermally converted from said second polycrystalline silicon film of said silicon resistor element and attached to said top face of said second polycrystalline silicon film of said silicon resistor elements; and each of said first and second connecting portions including a first polycrystalline silicon film continuously formed from said first polycrystalline silicon film of said silicon resistor element and a second polycrystalline silicon film continuously formed from said second polycrystalline silicon film of said silicon resistor element so that said first and second connecting portions have the same film construction as said silicon resistor element and are connected to said first and second metallic wiring layers on said upper surface of said insulating layer, respectively.

2. A semiconductor device of claim 1, wherein said first and second metallic wiring layers are aluminum layers.

3. A semiconductor device comprising a semiconductor substrate having a major surface and an impurity region which belongs to a circuit element; a thick field insulating layer selectively formed on said major surface of said substrate except on said impurity region; a thin insulating layer formed on said impurity region; a first contact hole formed in said thin insulating layer to expose a part of said impurity region; a silicon resistor element formed on said thick field insulating layer and on said thin insulating film continuously, and having a specified resistance value; a first connecting portion formed on said thin insulating layer and connected to one end of said silicon resistor element on said thin insulating layer and connected to said part of said impurity region through said first contact hole; and second connecting portion formed on said thick field insulating layer and connected to another end of said silicon resistor element on said thick field insulating layer; an insulating film formed on said resistor element; and inter-ply insulating layer formed on said insulating film and on said second connecting portion; a second contact hole formed in said inter-ply insulating layer to expose a part of said second connecting portion; and a metallic wiring layer formed on said inter-ply insulating layer and connected to said part of said second connecting portion through said second contact hole;

said silicon resistor element including a first polycrystalline silicon film having an upper face and containing oxygen of at most 15 atomic percents and being formed on said thick field insulating layer and on said thin insulating layer continuously with a thickness ranging from 100 Å to 1000 Å for determining substantially said specified resistance value of said silicon resistor element, and a second polycrystalline silicon film having a top face and containing oxygen of at least 20 atomic percents and being attached to said upper face of said first polycrystalline silicon film for protecting said upper face of said first polycrystalline silicon film from thermal oxidation;

said insulating film being a silicon oxide film thermally converted from said second polycrystalline silicon film of said silicon resistor element and attached to said top face of said second polycrystalline silicon film of said silicon resistor element;

each of said first and second connecting portions including a first polycrystalline silicon film continuously formed from said first crystalline silicon film of said silicon resistor element and a second polycrystalline silicon film continuously formed from said second polycrystalline silicon film of said silicon resistor element so that said first and second connecting portions have the same film construction as said silicon resistor element.

4. A semiconductor device of claim 3, wherein said first and second polycrystalline silicon films of said first and second connecting portions contain atoms selected from the group consisting of phosphorus atoms, arsenic atoms, and boron atoms with oxygen atoms.

5. A semiconductor device of claim 3, wherein said device has a static type random access memory cell including a pair of driver transistors, a pair of switching transistors and a pair of load resistors, said silicon resistor element being said load resistor, and said impurity region being one of a common source and drain region of said driver transistor and said switching transistor.

6. A semiconductor device of claim 3, wherein said inter-ply insulating layer is made of phospho-silicate glass.

7. A semiconductor device comprising a semiconductor substrate having a major surface; an insulating layer having an upper surface and formed on said major surface of said substrate; a silicon resistor element formed on said upper surface of said insulating layer and having a specified resistance value, said silicon resistor element having a predetermined length; an insulating film formed entirely on said silicon resistor element; and wiring structures formed on said upper surface of said insulating layer and connected to both ends of said silicon resistor element;

said silicon resistor element including a first polycrystalline silicon film having an upper face and containing oxygen of at least 15 atomic percents and being formed on said upper surface of said insulating layer with a thickness ranging from 100 Å to 1000 Å for determining substantially said specified resistance value of said silicon resistor element, and a second polycrystalline silicon film having a top face and containing oxygen of at least 20 atomic percent and being attached to said upper face of said first polycrystalline silicon film for protecting said upper face of said first polycrystalline silicon film from thermal oxidation;

said insulating film being a silicon oxide film thermally converted from said second polycrystalline silicon film of said silicon resistor element and attached to said top face of said second polycrystalline silicon film of said silicon resistor element, said silicon oxide film having said predetermined length between both ends of said silicon oxide film in a lengthwise direction; and each of said wiring structures including a first polycrystalline silicon film containing oxygen of at most 15 atomic percents and having a thickness ranging from 100 Å to 1000 Å and being continuously formed from said first polycrystalline silicon film of said silicon resistor element, a second polycrystalline silicon film containing oxygen of at least 20 atomic percents and being continuously formed from said second polycrystalline silicon film of said silicon resistor element, and a metal silicide film formed on said second polycrystalline silicon film of said wiring structure and terminating at said end of said silicon oxide film to define a boundary between said silicon resistor element and said wiring structure.

8. A semiconductor device of claim 7, wherein said metal silicide film is a high melting metal silicide film.

9. A semiconductor device of claim 8, wherein said high melting metal silicide film is a platinum silicide film.

* * * * *